United States Patent
Chang et al.

(10) Patent No.: US 6,843,264 B2
(45) Date of Patent: Jan. 18, 2005

(54) MULTI-PHASE PRESSURE CONTROL VALVE FOR PROCESS CHAMBER

(75) Inventors: Chih-Tien Chang, Hsinchu (TW); Hsueh-Chang Wu, Taipei (TW); Sunny Wu, Yunlin (TW); Chien-Ling Huang, Hsin-Chu (TW); Chin-Hsin Peng, Hsin-Chu (TW); Mei-Seng Zhou, Singapore (SG)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 7 days.

(21) Appl. No.: 10/323,377

(22) Filed: Dec. 18, 2002

(65) Prior Publication Data

US 2004/0118464 A1 Jun. 24, 2004

(51) Int. Cl.[7] .............................. F16K 11/10; F16K 1/18
(52) U.S. Cl. ................ 137/14; 137/599.16; 137/601.16; 137/630; 251/304
(58) Field of Search .................... 137/601.16, 1, 137/14, 599.16, 599.01, 601.14, 601.17, 628, 630, 630.15, 630.21; 251/304, 305

(56) References Cited

U.S. PATENT DOCUMENTS

| | | | | | |
|---|---|---|---|---|---|
| 1,130,103 | A | * | 3/1915 | Plumm | 123/337 |
| 1,872,213 | A | * | 8/1932 | Anderson | 126/285 R |
| 2,349,727 | A | * | 5/1944 | Hopkins | 137/552 |
| 2,796,082 | A | * | 6/1957 | Green et al. | 137/630.15 |
| 4,962,783 | A | * | 10/1990 | Ball et al. | 137/1 |
| 5,113,910 | A | * | 5/1992 | Ball | 137/630.15 |
| 5,462,080 | A | * | 10/1995 | Plavidal et al. | 137/337 |
| 6,273,136 | B1 | * | 8/2001 | Steinert et al. | 137/630 |
| 6,293,306 | B1 | * | 9/2001 | Brenes | 137/601.09 |
| 6,568,417 | B2 | * | 5/2003 | Laney | 137/15.25 |
| 6,630,201 | B2 | * | 10/2003 | Chiang et al. | 427/255.28 |

* cited by examiner

Primary Examiner—Ramesh Krishnamurthy
(74) Attorney, Agent, or Firm—Tung & Associates

(57) ABSTRACT

A new and improved, multi-phase pressure control valve for facilitating quick and accurate attainment and stabilization of gas pressure inside a semiconductor fabrication process chamber such as an etch chamber or CVD chamber. In one embodiment, the multi-phase pressure control valve is a butterfly-type valve which includes outer and inner vanes that independently control flow of gases from a process chamber to a vacuum pump. The larger-diameter outer vane stabilizes gas pressures within a large range, whereas the inner vane stabilizes pressure within a smaller range. In another embodiment, the multi-phase pressure control valve is a gate-type valve which may include a pivoting outer vane and an inner vane slidably disposed with respect to the outer vane for exposing a central gas flow opening in the outer vane.

8 Claims, 3 Drawing Sheets

MULTI-PHASE PRESSURE CONTROL VALVE FOR PROCESS CHAMBER

FIELD OF THE INVENTION

The present invention relates to valves for regulating chamber pressures of process chambers used in the fabrication of semiconductor integrated circuits. More particularly, the present invention relates to multi-phase pressure control valves for the rapid and accurate attainment of interior chamber gas pressures of process chambers such as etch chambers and CVD chambers.

BACKGROUND OF THE INVENTION

Integrated circuits are formed on a semiconductor substrate, which is typically composed of silicon. Such formation of integrated circuits involves sequentially forming or depositing multiple electrically conductive and insulative layers in or on the substrate. Chemical vapor deposition (CVD) processes are widely used to form layers of materials on a semiconductor wafer. CVD processes include thermal deposition processes, in which a gas is reacted with the heated surface of a semiconductor wafer substrate, as well as plasma-enhanced CVD processes, in which a gas is subjected to electromagnetic energy in order to transform the gas into a more reactive plasma. Forming a plasma can lower the temperature required to deposit a layer on the wafer substrate, to increase the rate of layer deposition, or both.

After the material layers are formed on the wafer substrate, etching processes may be used to form geometric patterns in the layers or vias for electrical contact between the layers. Etching processes include "wet" etching, in which one or more chemical reagents are brought into direct contact with the substrate, and "dry" etching, such as plasma etching. Various types of plasma etching processes are known in the art, including plasma etching, reactive ion (RI) etching and reactive ion beam etching. In each of these plasma processes, a gas is first introduced into a reaction chamber and then plasma is generated from the gas. This is accomplished by dissociation of the gas into ions, free radicals and electrons by using an RF (radio frequency) generator, which includes one or more electrodes. The electrons are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material on the semiconductor wafer to form residual products which leave the wafer surface and thus, etch the material from the wafer.

Referring to the schematic of FIG. 1, a wafer processing system, such as an etcher or CVD chamber, is generally indicated by reference numeral 10. The processing system 10 includes a reaction chamber 12 having a typically grounded chamber wall 14 closed by a chamber top 18. Source gases for wafer processing are provided by a gas supply 20. The gas supply 20 is coupled with the reaction chamber 12 through a gas control panel 22, which selects and controls the flow of the source gases into the reaction chamber 12. A semiconductor wafer 34 is supported on a wafer chuck 36 in the reaction chamber 12. Volatile reaction products and unreacted plasma or gas species are removed from the reaction chamber 12 by a gas removal mechanism, such as a vacuum pump 24 through a throttle valve 26.

The reaction chamber 12 may be a plasma etching chamber, in which the plasma formed in the chamber 12 includes high-energy ions, free radicals and electrons which react chemically with the surface material of the semiconductor wafer 34 to form reaction products that leave the surface of the wafer 34, thereby etching a geometrical pattern or a via in a wafer layer. The reaction chamber 12 may be a CVD chamber, in which gases are introduced into the reaction chamber 12 and a plasma may be formed from the gases in the reaction chamber 12. In a heterogenous, or surface-catalyzed reaction, the gas or plasma deposits a solid film on the surface of the wafer 34.

By regulating the flow of gases from the interior of the reaction chamber 12 to the vacuum pump 24, the throttle valve 26 of the system 10 is typically used to control the interior pressures of the reaction chamber 12. A cross-sectional view of a conventional butterfly-type throttle valve 26 is shown in FIG. 2. The conventional butterfly-type throttle valve 26 includes a cylindrical valve wall 27, in which is pivotally mounted a vane 28 at a pivot point 29. Upon flow of gases 30 from the reaction chamber 12 to the vacuum pump 26, the vane 28 pivots from the position indicated by the solid lines to the position indicated by the dashed lines, thereby regulating the flow rate of the gas from the reaction chamber 12, and thus, the interior pressure of the reaction chamber 12.

As shown in FIG. 3, an alternative conventional gate-type throttle valve 38 includes a cylindrical valve wall 39 having a vane 40 slidably mounted through a slot (not shown) in the valve wall 39 and pivotally mounted to the valve wall 39 at a pivot point 41. The vane 40 pivots to the open position shown in FIG. 3 from a closed position inside the valve interior 42 of the throttle valve 38 to establish flow of the gases from the reaction chamber 12 to the vacuum pump 24. The vane 40 partially blocks the valve interior 42 to prevent unimpeded flow of the gases, thereby regulating the flow rate of the gases through the throttle valve 38, and thus, the pressure of the gases in the reaction chamber 12.

One of the limitations inherent in the conventional single-unit throttle valves is that the valves are characterized by an inordinately long response time upon initial flow of gases into the reaction chamber in order to establish the desired pressure for the etching or CVD process. The valves are incapable of achieving both pressure accuracy and pressure stabilization at the desired value in a short period of time. Consequently, the gases flowing through the processing system from the time of initial gas flow onset until stabilization of the gas flow rate and interior chamber gas pressure, tend to be wasted. Accordingly, a new and improved, multi-phase pressure control valve, characterized by quick response or pressure stabilization time as well as pressure accuracy, is needed for semiconductor processing systems.

An object of the present invention is to provide a new and improved, multi-phase pressure control valve for process chambers used in the fabrication of semiconductors.

Another object of the present invention is to provide a new and improved, multi-phase pressure control valve for the quick and accurate stabilization of pressure in a process chamber.

Still another object of the present invention is to provide a new and improved, multi-phase pressure control valve which may be used in a variety of process chambers for semiconductor fabrication.

Yet another object of the present invention is to provide a new and improved, multi-phase pressure control valve which is particularly well-suited for use in etching chambers and CVD (chemical vapor deposition) chambers for semiconductor fabrication.

A still further object of the present invention is to provide a multi-phase pressure control valve which includes at least two control units for the quick and accurate establishment and stabilization of a desired pressure in a process chamber.

Yet another object of the present invention is to provide a multi-phase pressure control valve which may be readily installed in conventional semiconductor processing systems.

A still further object of the present invention is to provide a butterfly-type, multi-phase pressure control valve which may include outer and inner vanes for independently controlling flow of gases from a process chamber to a vacuum pump in order to facilitate quick and accurate attainment and stabilization of a desired interior chamber pressure for a semiconductor fabrication process chamber.

Another object of the present invention is to provide a gate-type multi-phase pressure control valve which may include a pivoting outer vane and an inner vane slidably disposed with respect to the outer vane for exposing a central gas flow opening in the outer vane, which outer and inner vanes independently facilitate flow of gases through the valve in order to quickly and precisely stabilize gas pressures in a semiconductor fabrication process chamber.

Still another object of the present invention is to provide a process-oriented design for a multi-phase pressure control valve.

SUMMARY OF THE INVENTION

In accordance with these and other objects and advantages, the present invention is generally directed to a new and improved, multi-phase pressure control valve for facilitating quick and accurate attainment and stabilization of gas pressure inside a semiconductor fabrication process chamber such as an etch chamber or CVD chamber. In one embodiment, the multi-phase pressure control valve is a butterfly-type valve which includes outer and inner vanes that independently control flow of gases from a process chamber to a vacuum pump. The larger-diameter outer vane stabilizes gas pressures within a large range, whereas the inner vane stabilizes pressure within a smaller range. In another embodiment, the multi-phase pressure control valve is a gate-type valve which includes a pivoting outer vane and an inner vane slidably disposed with respect to the outer vane for exposing a central gas flow opening in the outer vane. The outer and inner vanes independently facilitate flow of gases through the valve in order to quickly and precisely stabilize gas pressures in a semiconductor fabrication process chamber.

BRIEF DESCRIPTION OF THE DRAWINGS

The invention will now be described, by way of example, with reference to the accompanying drawings, in which.

DESCRIPTION OF THE PREFERRED EMBODIMENTS

When used herein, the term, "valve unit" shall refer to a butterfly valve vane, a gate valve vane or any other valve element which is capable of regulating or modulating flow of a gas through a conduit.

The present invention has particularly beneficial utility in the rapid establishment, stabilization and control of gas pressures inside a process chamber used in the fabrication of integrated circuits on semiconductor wafer substrates. However, the invention is not so limited in application, and while references may be made to such semiconductor fabrication process chambers, the present invention is more generally applicable to rapidly establishing, stabilizing and maintaining control of gas pressures inside process vessels in a variety of industrial and mechanical applications.

Figure 1:
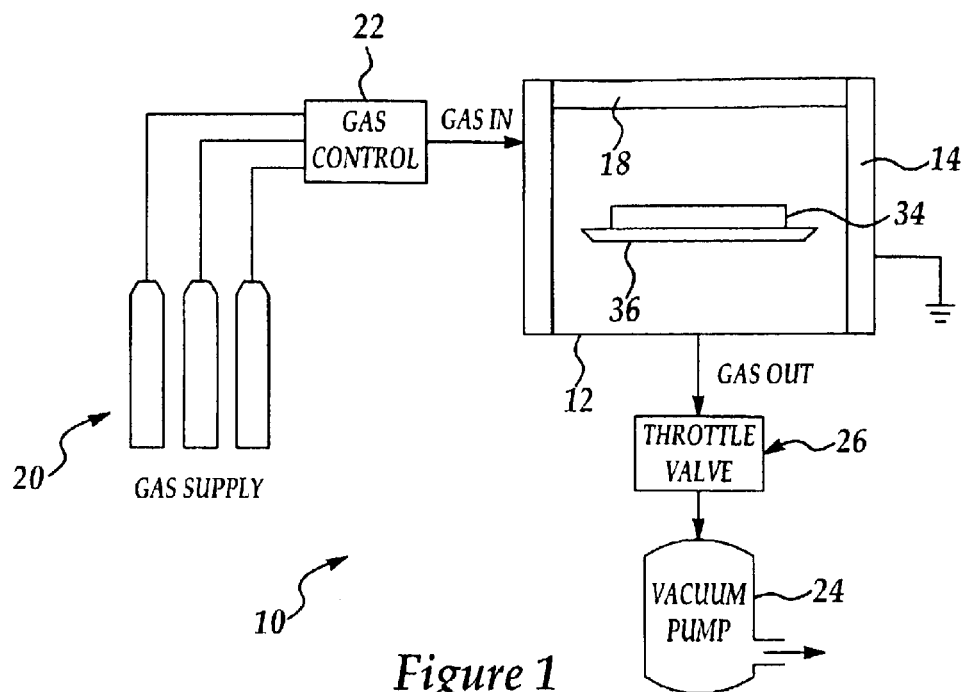
FIG. 1 is a schematic view of a typical conventional processing system for the fabrication of semiconductor integrated circuits.
Figure 2:
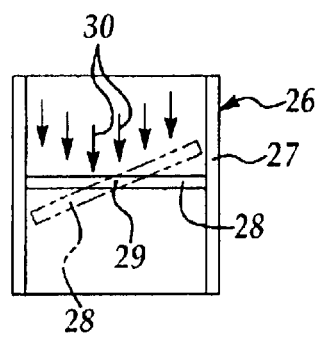
FIG. 2 is a longitudinal sectional view of a conventional throttle valve for a semiconductor fabrication process system.
Figure 3:
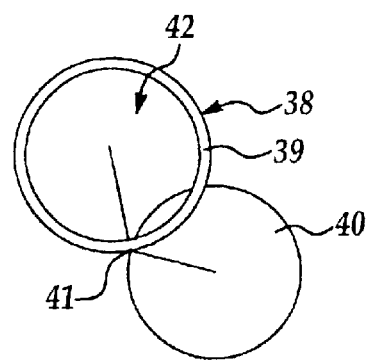
FIG. 3 is a cross-sectional view of another type of conventional throttle valve for a semiconductor fabrication process system.
Figure 4:
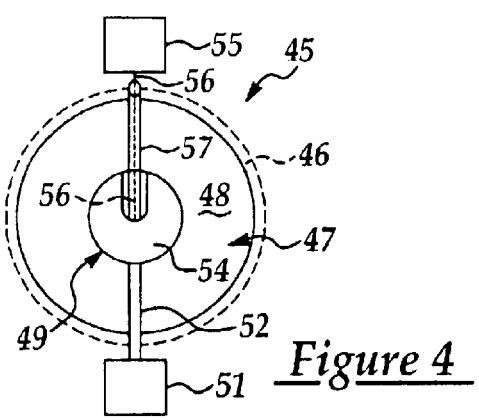
FIG. 4 is a top view of a butterfly-type multi-phase pressure control valve of the present invention, with the inner and outer vanes of the valve in the closed configuration.
Figure 4A:
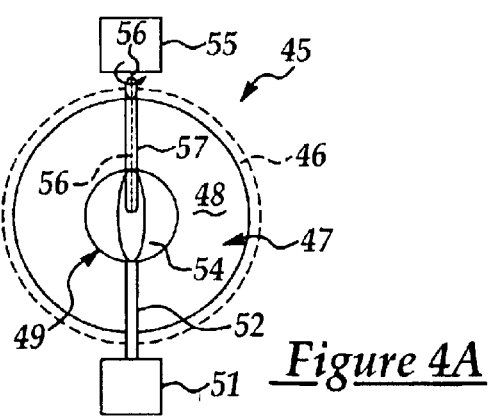
FIG. 4A is a top view of the valve of FIG. 4, with the inner vane of the valve in the open configuration.
Figure 4B:
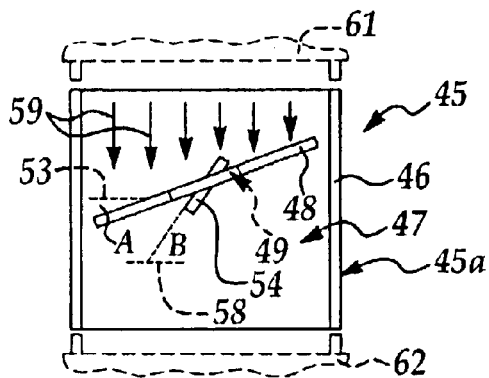
FIG. 4B is a longitudinal sectional view of the valve of FIGS. 4 and 4A, with the inner and outer vanes pivoted to the open configuration in operation of the valve.

Referring initially to FIGS. 4–4B, a first illustrative embodiment of the pressure control valve of the present invention is generally indicated by reference numeral 45. In typical application, the pressure control valve 45 connects an exhaust port on a process chamber 61 to a vacuum pump 62. The pressure control valve 45 includes a valve housing 45a having a cylindrical valve wall 46 which defines a valve interior 47. An annular outer vane 48, having a central opening 49, is mounted in the valve interior 47. In a preferred embodiment, the outer vane 48 may have a diameter of about 3 inches, although the outer vane 48 may have other diameters. The edge of the outer vane 48 normally engages the interior surface of the valve wall 46. A motor shaft 52 extends from operable engagement by an outer vane motor 51, through a shaft opening (not shown) provided in the valve wall 46, and is attached to or engages the outer vane 48. Accordingly, by operation of the outer vane motor 51, the motor shaft 52 is rotated and, in turn, rotates the outer vane 48 inside the valve interior 47. This positions the outer vane 48 at a throttle angle "A" with respect to the normally closed position 53 of the outer vane 48, as shown in FIG. 4B and hereinafter further described. A circular inner vane 54 is disposed in the central opening 49 of the outer vane 48, and normally closes the central opening 49 as shown in FIG. 4. In a preferred embodiment, the inner vane 54 has a diameter of about 2 inches, although the inner vane 54 may have other diameters. A motor shaft 56 extends from operable engagement by an inner vane motor 55, through a sheath 57 provided on the surface of the outer vane 48, and is attached to or engages the inner vane 54. Accordingly, by operation of the inner vane motor 55, the motor shaft 56 is rotated and, in turn, rotates the inner vane 54, independently of the outer vane 48, inside the central opening 49, as shown in FIG. 4A. This positions the inner vane 54 at a throttle angle "B" with respect to the normally closed position 58 of the inner vane 54, as shown in FIG. 4B and hereinafter further described.

Figure 6:
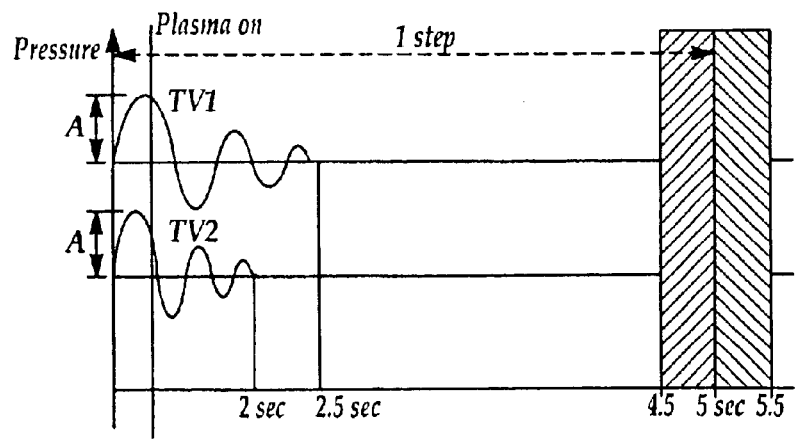
FIG. 6 is a graph with chamber pressure plotted vs. time, illustrating enhanced stabilization of gas pressure in a process chamber in implementation of the present invention.
Figure 7:
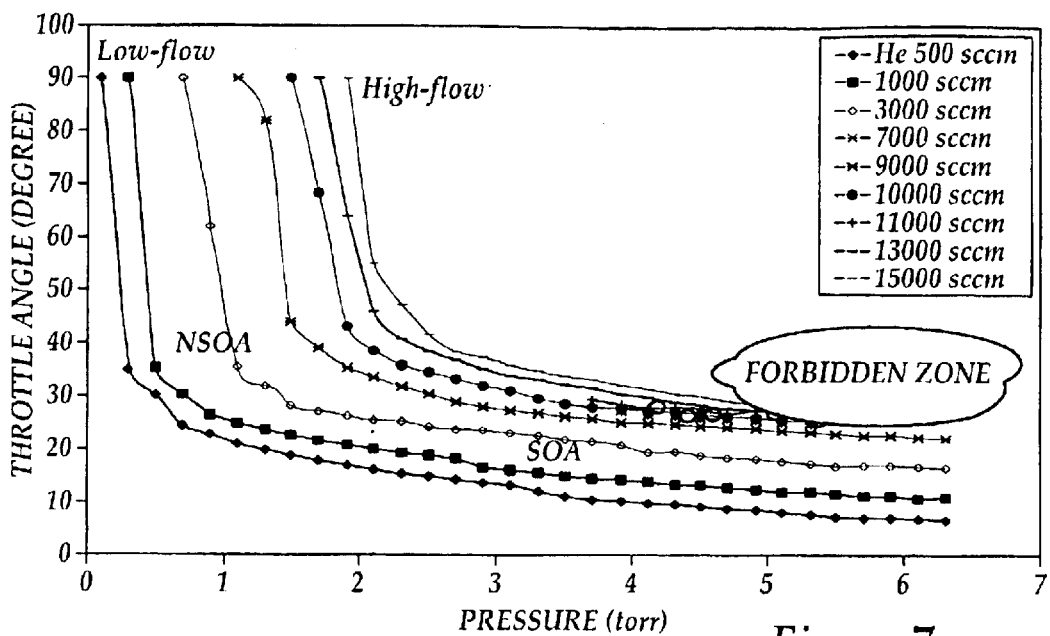
FIG. 7 is a graph with chamber pressure plotted as a function of valve angle for various gas flow rates in implementation of the present invention.
Figure 10:
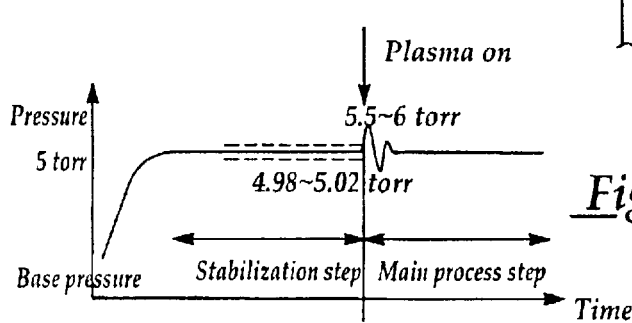
FIG. 10 is a graph with process chamber pressure plotted vs. time, illustrating a typical operational schematic for a semiconductor fabrication process in implementation of the present invention.

Referring again to FIGS. 4–4B and to FIG. 10, in operation the multi-phase pressure control valve 45 facilitates prompt attainment and stabilization of a target gas pressure inside the process chamber 61 at the onset of a processing operation such as a plasma etching or plasma CVD operation carried out in the process chamber 61. Accordingly, helium (He) gas 59 is typically used in the stabilization step prior to processing in order to attain and stabilize the desired target gas pressure inside the process chamber 61 for the processing operation. As the vacuum pump 62 draws the gas 59 from the process chamber 61 and through the valve interior 47, at a gas flow rate of typically from about 500 sccm to about 15,000 sccm, the outer vane motor 51 is operated to rotate the outer vane 48 from the closed position 53 to the open position shown by the solid lines in FIG. 4B, until the throttle angle "A" shown in FIG. 4B is typically from about 5 to about 15 degrees. Simultaneously, the inner vane motor 55 is operated to rotate the inner vane 54 until the throttle angle "B" shown in FIG. 4B is from about 20 to about 35 degrees. This facilitates a gas pressure of from about 4 Torr to about 6 Torr in the process chamber 61. As shown in FIG. 6, it will be appreciated by those skilled in the art that the inner vane 54, the gas stabilization profile of which is indicated by the bottom graph in FIG. 6, stabilizes the gas pressure to the desired target gas pressure in the process chamber 61 within about 2 seconds. The outer vane 48, the gas stabilization profile of which is indicated by the top graph in FIG. 6, stabilizes the gas pressure to the desired target gas pressure in the process chamber 61 within about 2.5 seconds. As shown in FIG. 6, processing recipes of semiconductor fabrication processes vary according to the time from onset of plasma inducement until the main processing step begins, typically from about 4.5 to about 5.5 seconds. Accordingly, the multi-phase pressure control valve 45 is capable of stabilizing the target gas pressure well within sufficient time before the main processing step begins. FIG. 7 illustrates interior chamber pressures at various flow rates of He gas as a function of various throttle angles of the outer vane 48 (bottom lines) and of the inner vane 54 (top lines), respectively. It will be appreciated from a consideration of FIG. 7 that the multi-phase pressure control valve 45 widens the safety-operation area of the process.

Figure 5:
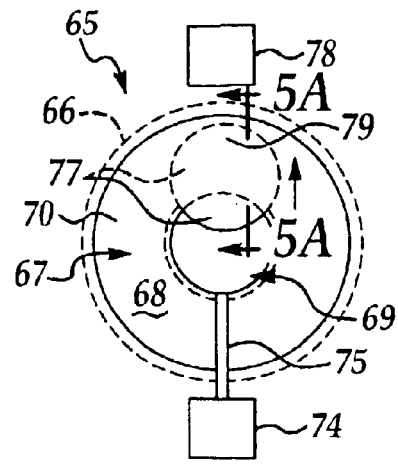
FIG. 5 is a top view of a gate-valve type multi-phase pressure control valve of the present invention, with the inner vane of the valve shown in the open configuration in operation of the valve.
Figure 5A:
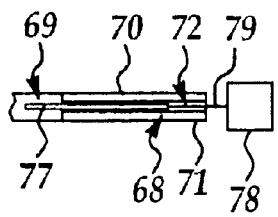
FIG. 5A is a sectional view, taken along section lines 5A—5A in FIG. 5.
Figure 5B:
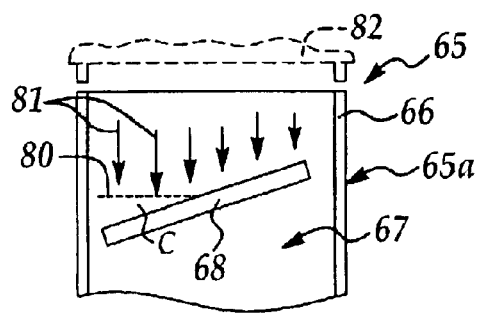
FIG. 5B is a longitudinal sectional view of the valve of FIG. 5, with the outer vane of the valve pivoted to the open configuration in operation of the valve.

Referring next to FIGS. 5–5B, a second illustrative embodiment of the multi-phase pressure control valve of the present invention is generally indicated by reference numeral 65. In typical application, the pressure control valve 65 connects an exhaust port on a process chamber 82 to a vacuum pump 83. The multi-phase pressure control valve 65 includes a valve housing 65a having a cylindrical valve wall 66 which defines a valve interior 67. An annular outer vane 68, having a central opening 69, is mounted in the valve interior 67. As shown in FIG. 5A, the outer vane 68 may include a top panel 70 and a bottom panel 71, between which is defined a pocket 72, the purpose of which will be hereinafter described. In a preferred embodiment, the outer vane 68 may have a diameter of about 3 inches, although the outer vane 68 may have other diameters. The edge of the outer vane 68 normally engages the interior surface of the valve wall 66, as shown in FIG. 5. A circular inner vane 77 is disposed in the central opening 69 of the outer vane 68, and normally closes the central opening 69 as shown in FIG. 5. In a preferred embodiment, the inner vane 77 has a diameter of about 2 inches, although the inner vane 77 may have other diameters. A motor shaft 75 extends from operable engagement by an outer vane motor 74, through a shaft opening (not shown) provided in the valve wall 66, and is attached to or engages the outer vane 68. By operation of the outer vane motor 74, the motor shaft 75 is rotated, and the motor shaft 75, in turn, rotates the outer vane 68 inside the valve interior 67. This positions the outer vane 68, as well as the inner vane 77, at an angle "C" with respect to the normally closed position 80 of the outer vane 68, as shown in FIG. 5B. A motor shaft 79 extends from operable engagement by an inner vane motor 78 and is attached to or engages the inner vane 77. Accordingly, by operation of the inner vane motor 78, the motor shaft 79 is retracted into the inner vane motor 78 to at least partially remove the inner vane 77 from the central opening 69 and retract the inner vane 77 at least partially into the pocket 72 of the outer vane 68, as shown in FIGS. 5 and 5A.

Referring again to FIGS. 5–5B, in operation helium (He) gas 81 is typically used in the stabilization step prior to processing in order to attain and stabilize the desired target gas pressure inside the process chamber 82 for the processing operation. As the vacuum pump 83 draws the gas 81 from the process chamber 82 and through the valve interior 67, at a gas flow rate of typically from about 500 sccm to about 15,000 sccm, the outer vane motor 74 is operated to rotate the outer vane 68 from the closed position 80 to the open position shown by the solid lines in FIG. 5B, until the throttle angle "C" shown in FIG. 5B is typically from about 5 to about 15 degrees. Simultaneously, the inner vane motor 78 is operated to withdraw the inner vane 77 from the central opening 69 and retract the inner vane 77 into the pocket 72 of the outer vane 68. This facilitates a gas pressure of from about 4 Torr to about 6 Torr in the process chamber 82. Accordingly, the multi-phase pressure control valve 65 is capable of stabilizing the target gas pressure in the process chamber 82 well within sufficient time before the main processing step begins.

Figure 8:
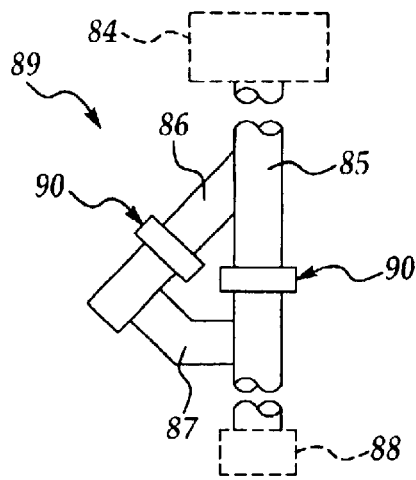
FIG. 8 is a side view, in section, of a valve piping system for another embodiment of the present invention.
Figure 9:
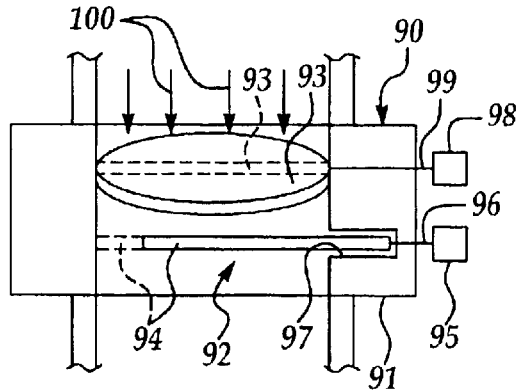
FIG. 9 is a sectional view of each of two multi-phase pressure control valves in the embodiment of the invention shown in FIG. 8.

Referring next to FIGS. 8 and 9, still another embodiment the invention includes a multi-phase valve conduit 89, by which the reaction chamber 84 is connected to the vacuum pump 88 through a main conduit 85. A diversion conduit 86 branches from the main conduit 85, and a connecting conduit 87 connects the downstream end of the diversion conduit 86 to the downstream end of the main conduit 85. A first multi-phase valve 90 is provided in the main conduit 85 between the entry point of the diversion conduit 86 and the re-entry point of the connecting conduit 87, and a second multi-phase valve 90 is provided in the diversion conduit 86, in parallel with the first multi-phase valve 90.

As shown in FIG. 9, each multi-phase valve 90 typically includes a valve housing 91 having a housing interior 92, in which is pivotally mounted a butterfly valve vane 93. A motor 98 engages the butterfly valve vane 93 through a motor shaft 99 which extends through a shaft opening (not shown) in the valve housing 91. The motor 98 is operable to partially rotate or pivot the butterfly valve vane 93 in the valve interior 92, between the closed position indicated by the dashed lines and the open position indicated by the solid lines. A gate valve vane 94 is mounted in the housing interior 92 downstream of the butterfly valve vane 93. Alternatively, the gate valve vane 94 may be mounted upstream of the butterfly valve vane 93. A motor 95 engages the gate valve vane 94 through a motor shaft 96. The motor 95 is capable of moving the gate valve vane 94 between a closed position in which the vane 94 closes the housing interior 92, as shown by the dashed lines, and an open position in which the vane 94 disengages the interior surface of the valve housing 91 and is partially retracted into a pocket 97 provided in the valve housing 91 to open the housing interior 92, as shown by the solid lines.

In operation of the multi-phase valve conduit 89, gas 100, such as helium, is drawn by operation of the pump 88 from the reaction chamber 84, through the multi-phase valve conduit 89, which establishes and stabilizes a target gas pressure inside the reaction chamber 84 as hereinafter described. Some of the gas 100 flows through the main conduit 85, while a portion of the gas 100 flows through the diversion conduit and connecting conduit 87 and re-enters the downstream end portion of the main conduit 85. As the gas 100 flows through the multi-phase pressure control valve 90 of the main conduit 85 and of the diversion conduit 86, respectively, the motor 98 rotates the butterfly valve vane 93 to a throttle angle of typically about 5 to about 15 degrees with respect to the closed position of the vane 93, indicated by the dashed lines in FIG. 9. Simultaneously, the motor 95 retracts the gate valve vane 94 from the closed position indicated by the dashed lines to the open position indicated by the solid lines in FIG. 9, into the pocket 97. Accordingly, it will be appreciated by those skilled in the art that each multi-phase pressure control valve 90 is capable of stabilizing the target gas pressure in the process chamber 84 well within sufficient time before the main processing step of the etching, CVD or other process begins.

While the preferred embodiments of the invention have been described above, it will be recognized and understood that various modifications can be made in the invention and the appended claims are intended to cover all such modifications which may fall within the spirit and scope of the invention.

What is claimed is:

1. A multi-unit pressure control valve for stabilizing a pressure of a gas in a vessel by operation of a pump, comprising:

a valve housing for confluently connecting the vessel and the pump;

a disc-shaped outer vane having a central opening and pivotally mounted in said valve housing;

a disc-shaped inner vane pivotally mounted in said central opening; and a valve actuating mechanism having an outer vane motor shaft operably engaging said outer vane for orienting said outer vane in various positions in said valve housing and an inner vane motor shaft operably engaging said inner vane opposite said outer vane motor shaft for orienting said inner vane in various positions in said central opening and modulating flow of the gas from the vessel, through said valve housing to the pump, said outer vane and said inner vane disposed in a common plane with said outer vane motor shaft and said inner vane motor shaft.

2. The valve of claim 1 wherein said valve acutating mechanism comprises at least two motors operably engaging said outer vane motor shaft and said inner vane motor shaft, respectively.

3. The valve of claim 2 wherein said at least two motors comprises first and second motors operably engaging said outer vane motor shaft and said inner vane motor shaft, respectively.

4. The valve of claim 1 wherein said outer vane has a diameter of about 3 inches and said inner vane has a diameter of about 2 inches.

5. The valve of claim 4 wherein said valve acutating mechanism comprises a first motor and a second motor operably engaging said outer vane motor shaft and said inner vane motor shaft, respectively.

6. A method of stabilizing a gas pressure in a process chamber by operation of a pump, comprising the steps of:

providing a valve housing between said process chamber and said pump;

pivotally mounting an annular outer vane having a central opening in said valve housing;

pivotally mounting a disc-shaped inner vane in said central opening;

attaching an outer vane motor shaft to said outer vane in coplanar relationship to said outer vane;

attaching an inner vane motor shaft to said inner vane in coplanar relationship to said inner vane;

flowing the gas from said process chamber, through said valve housing and to said pump; and orienting said outer vane and said inner vane in said valve housing by actuation of said outer vane motor shaft and said inner vane motor shaft, respectively, to modulate flow of the gas from the vessel, through said valve housing to the pump.

7. The method of claim 6 wherein said orienting said outer vane and said inner vane comprises positioning said outer vane at a throttle angle of from about 5 degrees to about 15 degrees and positioning said inner vane at a throttle angle of from about 20 degrees to about 35 degrees.

8. The method of claim 6 wherein said flowing the gas from said process chamber, through said valve housing and to said pump comprises flowing the gas at a gas flow rate of from about 500 sccm to about 15,000 sccm.

* * * * *